(12) United States Patent
Frankel et al.

(10) Patent No.: US 11,313,936 B2
(45) Date of Patent: Apr. 26, 2022

(54) PROBE SYSTEMS AND METHODS FOR CHARACTERIZING OPTICAL COUPLING BETWEEN AN OPTICAL PROBE OF A PROBE SYSTEM AND A CALIBRATION STRUCTURE

(71) Applicant: FormFactor, Inc., Livermore, CA (US)

(72) Inventors: Joseph George Frankel, Beaverton, OR (US); Kazuki Negishi, Hillsboro, OR (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 17/028,102

(22) Filed: Sep. 22, 2020

(65) Prior Publication Data
US 2021/0096206 A1    Apr. 1, 2021

Related U.S. Application Data

(60) Provisional application No. 62/939,399, filed on Nov. 22, 2019, provisional application No. 62/908,440, (Continued)

(51) Int. Cl.
*G01R 35/00* (2006.01)
*G01R 31/308* (2006.01)
(Continued)

(52) U.S. Cl.
CPC ....... *G01R 35/005* (2013.01); *G01R 1/06794* (2013.01); *G01R 31/2889* (2013.01); *G01R 31/2891* (2013.01); *G01R 31/308* (2013.01)

(58) Field of Classification Search
CPC .. G01R 1/06727; G01R 1/08; G01R 31/2891; G01R 31/2887; G01R 31/308–311; G01B 7/082; G01B 21/042
(Continued)

(56) References Cited

U.S. PATENT DOCUMENTS

| 5,412,330 A | 5/1995 | Ravel et al. |
| 2006/0109015 A1 | 5/2006 | Thacker et al. |

(Continued)

OTHER PUBLICATIONS

U.S. Appl. No. 16/914,913, filed Jun. 29, 2020, Frankel.
U.S. Appl. No. 16/884,921, filed May 27, 2020, Negishi, et al.

*Primary Examiner* — Jermele M Hollington
*Assistant Examiner* — Courtney G McDonnough
(74) *Attorney, Agent, or Firm* — Dascenzo Gates Intellectual Property Law, P.C.

(57) ABSTRACT

Probe systems and methods of characterizing optical coupling between an optical probe of a probe system and a calibration structure. The probe systems include a probe assembly that includes an optical probe, a support surface configured to support a substrate, and a signal generation and analysis assembly configured to generate an optical signal and to provide the optical signal to the optical device via the optical probe. The probe systems also include an electrically actuated positioning assembly, a calibration structure configured to receive the optical signal, and an optical detector configured to detect a signal intensity of the optical signal. The probe systems further include a controller programmed to control the probe system to generate a representation of signal intensity as a function of the relative orientation between the optical probe and the calibration structure. The methods include methods of operating the probe systems.

23 Claims, 6 Drawing Sheets

Related U.S. Application Data filed on Sep. 30, 2019, provisional application No. 62/908,403, filed on Sep. 30, 2019, provisional application No. 62/908,423, filed on Sep. 30, 2019.

(51) Int. Cl.
  *G01R 1/067* (2006.01)
  *G01R 31/28* (2006.01)

(58) Field of Classification Search
  USPC .................................................. 324/750.02
  See application file for complete search history.

(56) References Cited

U.S. PATENT DOCUMENTS

| | | |
|---|---|---|
| 2014/0268167 A1 | 9/2014 | Friedman et al. |
| 2016/0239720 A1 | 8/2016 | Enami et al. |

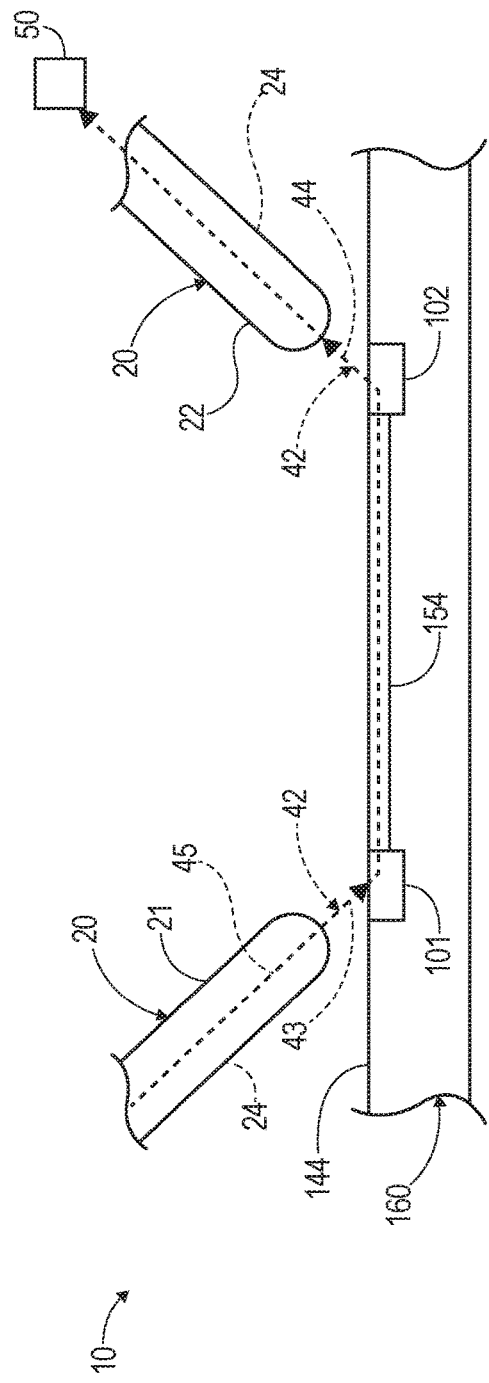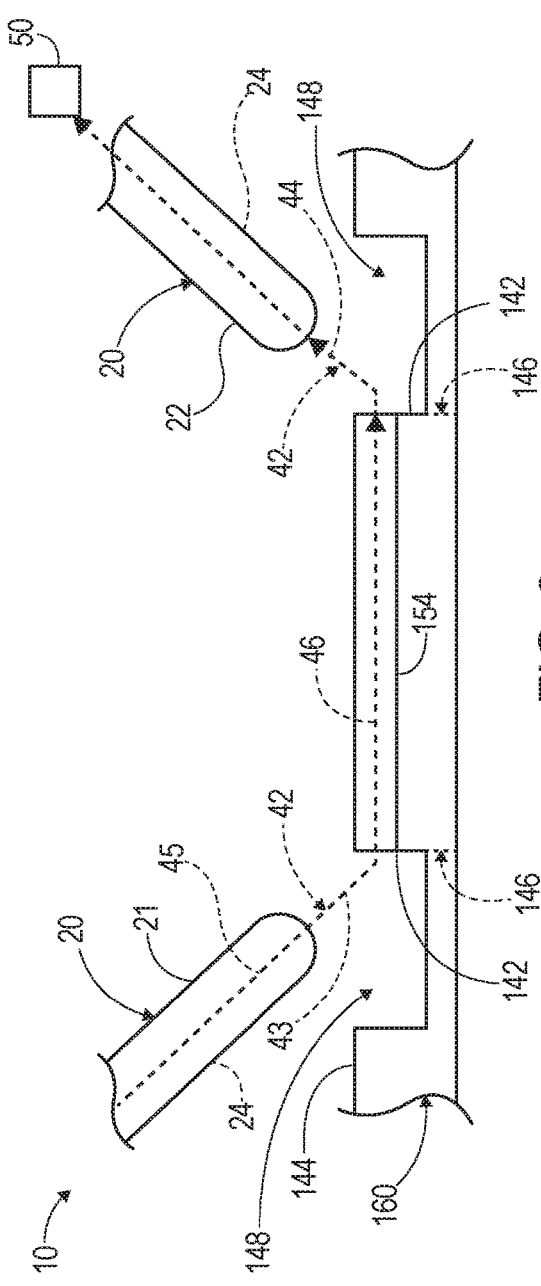

PROBE SYSTEMS AND METHODS FOR CHARACTERIZING OPTICAL COUPLING BETWEEN AN OPTICAL PROBE OF A PROBE SYSTEM AND A CALIBRATION STRUCTURE

RELATED APPLICATIONS

This application claims priority to U.S. Provisional Patent Application Nos. 62/908,403, 62/908,423, and 62/908,440, which were filed on Sep. 30, 2019, and U.S. Provisional Patent Application No. 62/939,399, which was filed on Nov. 22, 2019, and the complete disclosures of which are hereby incorporated by reference.

FIELD OF THE DISCLOSURE

The present disclosure relates generally to probe systems and methods for characterizing optical coupling between an optical probe of a probe system and a calibration structure.

BACKGROUND OF THE DISCLOSURE

Probe systems may be utilized to probe and/or to test the operation of a device under test (DUT). Optical probe systems have been developed to probe optical DUTs that include optical components. Optical probe systems utilize optical probes to provide signals, such as photonic signals, electromagnetic signals, and/or photons, to an optical device of the optical DUT and/or receive the signals from the optical device. In general, the optical probe and the optical device are positioned in a spaced-apart relationship, with a gap, or an air gap, of a few micrometers separating the optical probe and the optical device. Optical coupling, or an efficiency of the optical coupling, between the optical probe and the optical device can vary by orders of magnitude based upon a variety of factors, including a relative orientation, or alignment, between the optical probe and the DUT, optical characteristics of the optical probe itself, and/or optical characteristics of the DUT. It may be desirable to quantify this variation, such as to permit and/or facilitate more accurate determination of the optical properties of the optical device. Thus, there exists a need for improved methods of characterizing optical coupling between an optical probe of a probe system and an optical device and/or for probe systems that perform the methods.

SUMMARY OF THE DISCLOSURE

Probe systems and methods of characterizing optical coupling between an optical probe of a probe system and a calibration structure. The probe systems include a probe assembly that includes an optical probe, a support surface configured to support a substrate that includes a device under test (DUT), and a signal generation and analysis assembly configured to generate an optical signal and to provide the optical signal to the optical device via the optical probe. The probe systems also include an electrically actuated positioning assembly configured to selectively adjust a relative orientation between the optical probe and the DUT, a calibration structure configured to receive the optical signal, and an optical detector configured to detect a signal intensity of the optical signal.

The probe systems further include a controller programmed to control the operation of the probe system by positioning the optical probe and the calibration structure proximate one another and conveying the optical signal from the optical probe to the calibration structure. During the conveying, the controller also is programmed to control the operation of the probe system by detecting the signal intensity of the optical signal. During the conveying and also during the detecting, the controller further is programmed to control the operation of the probe system by changing the relative orientation between the optical probe and the calibration structure to generate a representation of signal intensity as a function of the relative orientation between the optical probe and the calibration structure.

The methods include positioning the optical probe and the calibration structure proximate one another and conveying an optical signal from the optical probe to the calibration structure. During the conveying, the methods also include detecting a signal intensity of the optical signal. During the conveying and also during the detecting, the methods further include changing a relative orientation between the optical probe and the calibration structure to generate a representation of the signal intensity as a function of the relative orientation between the optical probe and the calibration structure.

BRIEF DESCRIPTION OF THE DRAWINGS

FIG. 2 is a less schematic illustration of examples of a region of the probe system of FIG. 1.

FIG. 3 is a less schematic illustration of examples of a region of the probe system of FIG. 1.

DETAILED DESCRIPTION AND BEST MODE OF THE DISCLOSURE

Figure 1:
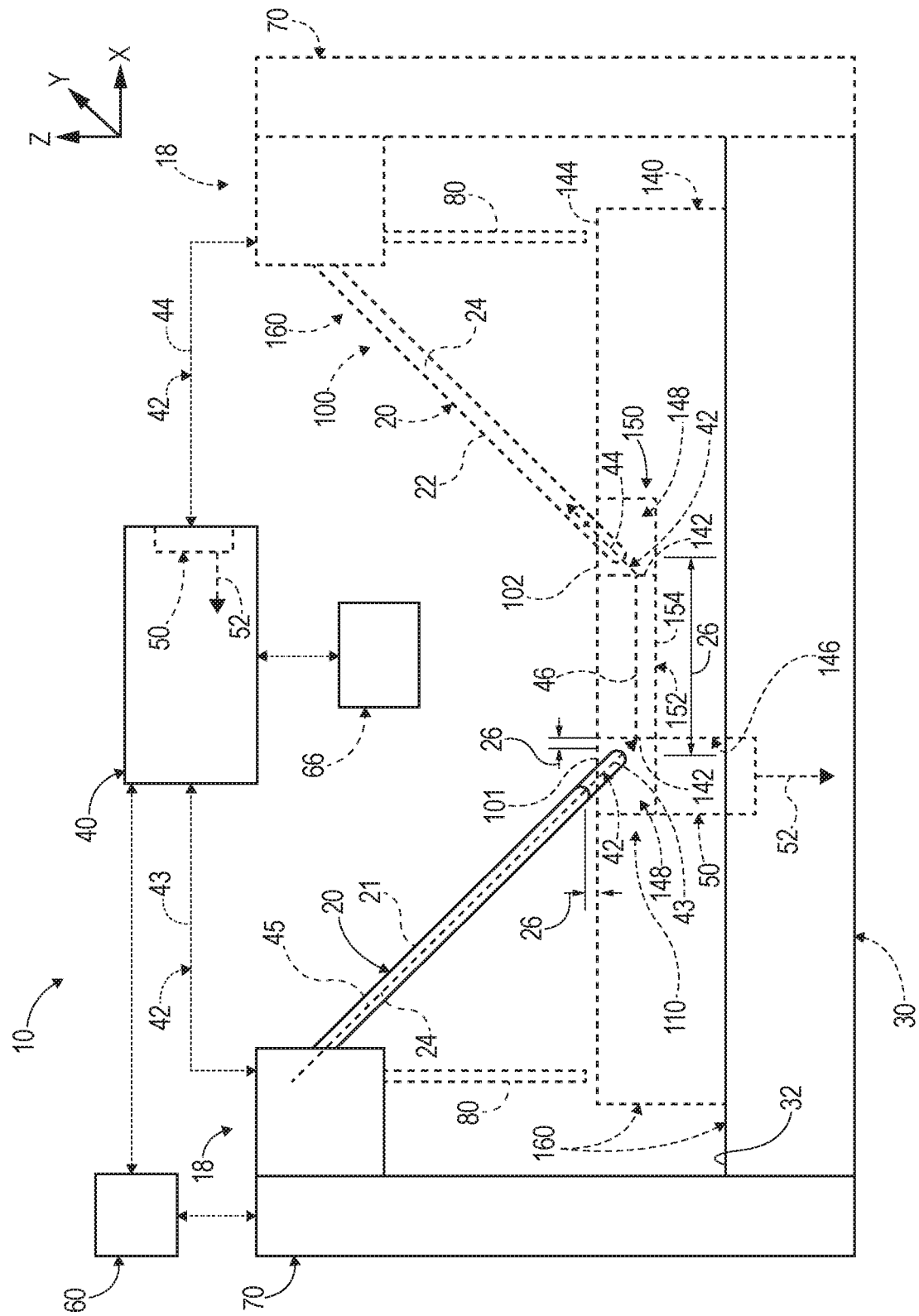
FIG. 1 is a schematic illustration of examples of probe systems that may be utilized to perform methods according to the present disclosure.

FIGS. 1-7 provide examples of probe systems 10 and/or of methods 200, according to the present disclosure. Elements that serve a similar, or at least substantially similar, purpose are labeled with like numbers in each of FIGS. 1-7, and these elements may not be discussed in detail herein with reference to each of FIGS. 1-7. Similarly, all elements may not be labeled in each of FIGS. 1-7, but reference numerals associated therewith may be utilized herein for consistency. Elements, components, and/or features that are discussed herein with reference to one or more of FIGS. 1-7 may be included in and/or utilized with any of FIGS. 1-7 without departing from the scope of the present disclosure. In general, elements that are likely to be included in a particular embodiment are illustrated in solid lines, while elements that are optional are illustrated in dashed lines. However, elements that are shown in solid lines may not be essential and, in some embodiments, may be omitted without departing from the scope of the present disclosure.

FIG. 1 is a schematic illustration of examples of probe systems 10 that may be utilized to perform methods 200, according to the present disclosure. Probe systems 10 include a probe assembly 18 that includes an optical probe 20. Probe systems 10 also include a support surface 32 configured to support a substrate 140 that includes a device under test (DUT) 150. The DUT may include an optical device 152. Probe systems 10 further include a signal generation and analysis assembly 40 that may be configured to generate an optical signal 42, in the form of an input optical signal 43, and/or to provide input optical signal 43 to optical device 152 via optical probe 20. Probe systems 10 also include an electrically actuated positioning assembly 70, which may be configured to selectively adjust a relative orientation between optical probe 20 and DUT 150. Probe systems 10 further include an optical detector 50, which may be configured to detect a signal intensity of optical signal 42, such as of input optical signal 43 that is received by the optical device and/or of an output optical signal 44 that is emitted from the optical device. Probe systems 10 also include a controller 60, which may be programmed to control the operation of at least one component of the probe system.

In one configuration, FIG. 1 illustrates probe systems 10 as utilized to test, or to optically test, the operation, or the optical operation, of optical device 152 of DUT 150. In such a configuration, optical probe 20 may be utilized to provide input optical signal 43 to the optical device of the DUT. The input optical signal may be transferred, or optically coupled, from the optical probe to optical device 152 of DUT 150 via and/or across a gap 26. Gap 26 also may be referred to herein as an air gap 26 and/or as a distance 26 that the input optical signal travels between the optical probe and the optical device of the DUT. As discussed, a coupling efficiency between the optical probe and the optical device of the DUT, via gap 26, may depend upon a variety of factors, including a relative orientation between the optical probe and the optical device of the DUT, one or more optical characteristics of the optical probe, one or more optical characteristics of the optical device, and/or one or more optical characteristics of a coupling structure, such as a grating coupler and/or a waveguide of the optical device.

It may be beneficial and/or desirable to maximize, optimize, and/or increase this coupling efficiency, to decrease the impact of variations in this coupling efficiency on a measured performance of the optical device of the DUT, and/or to quantify this coupling efficiency as a function of the relative orientation between the optical probe and the DUT. Additionally or alternatively, it may be beneficial and/or desirable to quantify the impact of coupling efficiency, or of variations in this coupling efficiency, on the measured performance of the optical device of the DUT. This may be accomplished by improved characterization of the optical coupling, such as via utilizing probe systems 10 and/or methods 200 disclosed herein.

Figure 5:
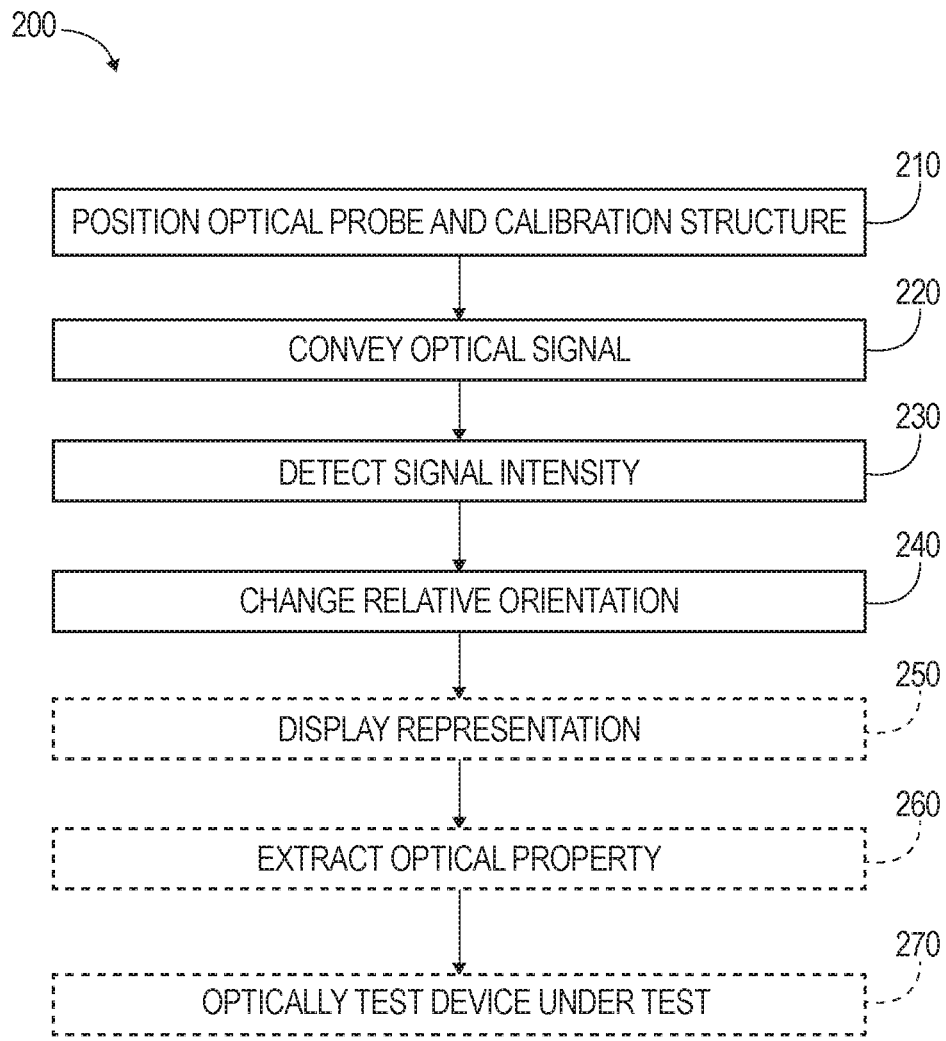
FIG. 5 is a flowchart depicting examples of methods of characterizing optical coupling between an optical probe of a probe system and a calibration structure according to the present disclosure.

As discussed in more detail herein with reference to FIG. 5, FIG. 1 also schematically illustrates probe systems 10 as being utilized to characterize optical performance of optical probe 20, such as to improve and/or facilitate improved optical testing of the DUT. In such a configuration, substrate 140 may include a calibration structure 160 and/or the calibration structure may be utilized in place of the substrate. Additionally or alternatively, and in some examples, DUT 150 may include calibration structure 160 and/or calibration structure 160 may be defined by the DUT. Calibration structure 160 also may be referred to herein as and/or may be an optical calibration structure 160, an optical structure 160, and/or an optically active structure 160.

In some such examples, the optical probe may include and/or be a first optical probe, and probe system 10 may include a second optical probe 22, which may function as, may form a portion of, and/or may be the calibration structure. In such a configuration, second optical probe 22 also may be referred to herein as a device optical fiber 100, and gap 26 may, in some examples, be measured between the first optical probe and the second optical probe. In another example, calibration structure 160 may be positioned on, and/or may define, support surface 32.

In some examples, the calibration structure may be configured to convey at least a portion of the input optical signal between a first optical probe 21 and second optical probe 22. In some such examples, and as illustrated in FIGS. 1-2, calibration structure 160 may include a first grating coupler 101, a second grating coupler 102, and a waveguide 154 that extends between the first grating coupler and the second grating coupler. In some such examples, the first probe and the second probe may be positioned above an upper surface 144 of calibration structure 160, and the first optical probe may be configured to provide input optical signal 43 to first grating coupler 101 along a signal axis 45, which also may be referred to herein as an incident axis 45, that defines an angle of incidence with the first grating coupler. The first grating coupler may receive at least a coupled portion of the input optical signal and may provide the coupled portion of the input optical signal to waveguide 154. The waveguide may provide the coupled portion of the input optical signal to second grating coupler 102, which then may provide output optical signal 44 to second optical probe 22. Optical detector 50 then may quantify the output optical signal.

In some such examples, and as illustrated in FIGS. 1 and 3, calibration structure 160 may define a vertical surface 142, such as a vertical surface of a trench 148 that may be defined within the substrate and/or of an edge 146 of the substrate. In these examples, first optical probe 21 may be positioned along the vertical surface and/or may provide input optical signal 43 to waveguide 154 such that the coupled portion of the input optical signal propagates within the waveguide along a waveguide signal axis 46. The waveguide then may convey the coupled portion of the optical signal to second optical probe 22, which may convey output optical signal 44 to optical detector 50. Optical detector 50 then may quantify the output optical signal.

Figure 4:
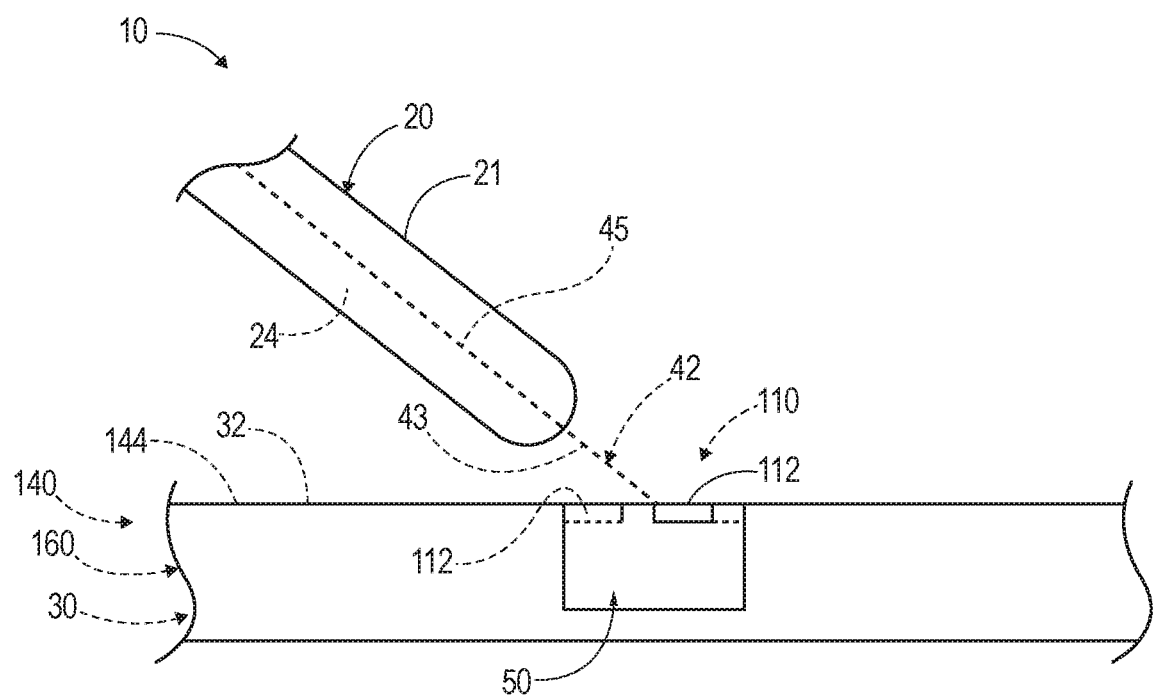
FIG. 4 is a less schematic illustration of examples of a region of the probe system of FIG. 1.

In some examples, and as illustrated in FIGS. 1 and 4, optical detector 50 may define, or may be positioned within, calibration structure 160, support surface 32, and/or a chuck 30 that defines support surface 32. In some such examples, and as perhaps best illustrated in FIG. 4, calibration structure 160 may include and/or be an obstructive calibration structure 110. The obstructive calibration structure may include an optical obstruction 112 and may be configured to selectively obstruct an obstructed portion of input optical signal 43 such that the obstructed portion of the input optical signal is not incident upon the optical detector and thus to permit and/or facilitate characterization of the input optical signal. Examples of the obstructive calibration structure are discussed in more detail herein and include an optically reflective region, an optically absorptive region, a knife-edge calibration structure, and/or a pinhole calibration structure.

Regardless of the exact configuration, and as discussed in more detail herein, probe system 10 may be configured to convey a suitable optical signal 42, such as input optical signal 43 and/or output optical signal 44, from the optical probe to the calibration structure and to detect an intensity of the optical signal received by the calibration structure. Probe system 10 also may be configured to change a relative orientation between the optical probe and the calibration structure to generate a representation of signal intensity as a function of the relative orientation between the optical probe and the calibration structure, which also may be referred to herein as a "three-dimensional representation."

Stated another way, probe system 10 may be configured to and/or methods 200 may be utilized to characterize optical coupling between optical probe 20 and calibration structure 160, such as between the optical probe and a grating coupler and/or a waveguide of the calibration structure. This optical coupling may include a convolution of effects, some of which may be due to and/or caused by one or more optical characteristics of the optical probe and some of which may be due to and/or caused by one or more optical characteristics of the calibration structure. In some examples, probe system 10 and/or methods 200 may be utilized to deconvolute these effects, thereby permitting an operator of the probe system to more fully understand and/or characterize a given optical probe and/or a given calibration structure. In some examples, probe systems 10 and/or methods 200 may be utilized to detect and/or to determine an improved, desired, and/or optimal relative orientation between the optical probe and the calibration structure, such as to permit and/or to facilitate improved, higher-sensitivity, and/or lower-noise testing of an optical device by the probe system.

Probe assembly 18 may include any suitable structure that may include optical probes 20, including first optical probe 21 and/or second optical probe 22. As an example, probe assembly 18 and/or optical probe 20 thereof may include and/or be a fiber optic cable 24. Examples of fiber optic cable 24 include a cleaved fiber optic cable, a lensed fiber optic cable, a 3-D printed fiber assembly, and/or a faceted fiber optic cable. Optical probe 20 may be configured to convey optical signals 42, examples of which include infrared (IR) optical signals and/or visible spectrum optical signals.

Support surface 32 may include any suitable surface that may be adapted, configured, designed, sized, and/or constructed to support, or to operatively support, substrate 140. As an example, probe system 10 may include chuck 30 that may form and/or define support surface 32. Examples of chuck 30 include a wafer chuck, a calibration chuck, a vacuum chuck, and/or a temperature-controlled chuck. As another example, support surface 32 may be formed and/or defined by calibration structure 160.

Signal generation and analysis assembly 40 may include any suitable structure that may be adapted, configured, designed, and/or constructed to generate optical signal 42, such as in the form of input optical signal 43, and/or to provide the input optical signal to optical probe 20. In some examples, signal generation and analysis assembly 40 also may be configured to receive at least a portion of output signal 44 from substrate 140 and/or from calibration structure 160. In such a configuration, the signal generation and analysis assembly may include optical detector 50.

Signal generation and analysis assembly 40 additionally or alternatively may be configured to generate an electronic test signal, such as may be provided to DUT 150 via a corresponding electrical probe 80, and/or to receive an electronic resultant signal, such as may be received from DUT 150 via a corresponding electrical probe 80. Signal generation and analysis assembly 40 additionally or alternatively may be adapted, configured, designed, and/or constructed to analyze the operation and/or performance of DUT 150, such as may be based upon the input optical signal, the output optical signal, the electronic test signal, and/or the electronic resultant signal. Examples of signal generation and analysis assembly 40 include an optical signal generator, a laser, an optical signal detector, an electric signal generator, and/or an electric signal analyzer.

Electrically actuated positioning assembly 70 may include any suitable structure that may be adapted, configured, designed, and/or constructed to selectively adjust the relative orientation between optical probe 20 and substrate 140, DUT 150, and/or calibration structure 160. This may include selective and/or operative adjustment of the absolute position of the optical probe relative to the substrate, of the optical probe relative to the DUT, of the optical probe relative to the calibration structure, of the substrate relative to the optical probe, of the DUT relative to the optical probe, and/or of the calibration structure relative to the optical probe. Examples of electrically actuated positioning assembly 70 include a piezoelectric positioning assembly, a motorized positioning assembly, and/or a stepper motor.

Optical detector 50 may include any suitable structure that may be adapted, configured, designed, and/or constructed to detect the signal intensity of input optical signal 43 and/or output optical signal 44 as received by, emitted from, and/or coupled to the substrate, the DUT, an optical device of the DUT, and/or the calibration structure. In some examples, optical detector 50 may be configured to produce and/or to generate a signal intensity output, which also may be referred to herein as an electrical signal intensity output, 52. Probe system 10 may provide the signal intensity output to controller 60 and/or to signal generation and analysis assembly 40. Examples of optical detector 50 include an optical power meter, a photo detector, and/or a photo diode.

In some examples, optical detector 50 may be associated with, may form a portion of, and/or may be incorporated within signal generation and analysis assembly 40. In some such examples, optical detector 50 may be configured to detect and/or to quantify output optical signal 44 after the output optical signal has been emitted from the DUT, such as after the input optical signal has been coupled to, or conveyed through, the substrate, the DUT, the optical device, and/or the calibration structure to generate the output optical signal. Stated another way, and in some such examples, optical detector 50 may be configured to detect output optical signal 44 as conveyed from substrate 140 and/or calibration structure 160 by second optical probe 22.

In some examples, optical detector 50 may be associated with, may form a portion of, and/or may be incorporated within substrate 140, calibration structure 160, and/or chuck 30. In some such examples, optical detector 50 may be configured to detect and/or to quantify input optical signal 43 prior to the input optical signal being coupled to, or conveyed through, the substrate, the DUT, the optical device, and/or the calibration structure. Stated another way, and in some such examples, optical detector 50 may be configured to detect input optical signal 43 as conveyed toward and/or to substrate 140 and/or calibration structure 160 via first optical probe 21.

Calibration structure 160 may include any suitable structure that may, or that may be utilized to, convey input optical signal 43 from optical probe 20, or from first optical probe 21, to a corresponding optical detector 50, that may be configured to generate output optical signal 44, and/or that may be configured to move relative to the optical probe. Examples of calibration structure 160 are disclosed herein. Additional examples of calibration structure 160 include a calibration chuck, examples of which are disclosed in U.S.

patent application Ser. No. 16/884,921, the complete disclosure of which is hereby incorporated by reference.

Controller 60 may include and/or be any suitable structure, device, and/or devices that may be adapted, configured, designed, constructed, and/or programmed to perform one or more of the functions disclosed herein. This may include control of the operation of any suitable portion, region, and/or structure of probe system 10, such as electrically actuated positioning assembly 70. This additionally or alternatively may include control according to any suitable step and/or steps of methods 200. As examples, controller 60 may include one or more of an electronic controller, a dedicated controller, a special-purpose controller, a personal computer, a special-purpose computer, a display device, a logic device, a memory device, and/or a memory device having computer-readable storage media.

The computer-readable storage media, when present, also may be referred to herein as non-transitory computer readable storage media. This non-transitory computer readable storage media may include, define, house, and/or store computer-executable instructions, programs, and/or code; and these computer-executable instructions may direct probe system 10 and/or controller 60 thereof to perform any suitable portion, or subset, of methods 200. Examples of such non-transitory computer-readable storage media include CD-ROMs, disks, hard drives, flash memory, etc. As used herein, storage, or memory, devices and/or media having computer-executable instructions, as well as computer-implemented methods and other methods according to the present disclosure, are considered to be within the scope of subject matter deemed patentable in accordance with Section 101 of Title 35 of the United States Code.

As illustrated in dashed lines in FIG. 1, and in some examples, probe systems 10 may include a display 66. Display 66, when present, may be configured to display, or to visibly display, an image, a representation, a multi-dimensional representation, a two-dimensional representation, and/or a three-dimensional representation of signal intensity as a function of the relative orientation between the optical probe and the calibration structure, such as to an operator of the probe system. Examples of display 66 include a monitor, a computer monitor, a television screen, and/or a flat panel display.

Substrate 140, when present, may include and/or be any suitable structure and/or structures. As an example, and as discussed, substrate 140 may include and/or be calibration structure 160, examples of which are disclosed herein. As additional examples, substrate 140 may include and/or be a wafer, a semiconductor wafer, a silicon wafer, a Group III-V semiconductor wafer, and/or an optical device wafer, and/or an optoelectronic device wafer. Device under test 150, when present, may include and/or be any suitable optical device and/or optoelectronic device.

FIG. 5 is a flowchart depicting examples of methods 200 of characterizing optical coupling between an optical probe of a probe system and a calibration structure, according to the present disclosure. Methods 200 include positioning an optical probe and an optical device at 210, conveying an optical signal at 220, and detecting a signal intensity at 230. Methods 200 also include changing a relative orientation at 240 and may include displaying a representation at 250, extracting an optical property at 260, and/or optically testing a device under test at 270.

Positioning the optical probe and the optical device at 210 may include positioning the optical probe and the calibration structure relative to and/or proximate one another. This may include positioning such that a gap, or an air gap, spatially separates the optical probe and the calibration structure. The gap, a length of the gap, and/or a distance between the optical probe and the calibration structure may have any suitable value. As examples, the distance may be at least 0.1 micrometer, at least 0.25 micrometers, at least 0.5 micrometers, at least 0.75 micrometers, at least 1 micrometer, at least 2 micrometers, at least 3 micrometers, at least 4 micrometers, at least 5 micrometers, at least 7.5 micrometers, at least 10 micrometers, at least 15 micrometers, at least 20 micrometers, at least 25 micrometers, at least 30 micrometers, at least 40 micrometers, at most 100 micrometers, at most 75 micrometers, at most 50 micrometers, at most 25 micrometers, at most 20 micrometers, at most 15 micrometers, at most 10 micrometers, at most 8 micrometers, at most 6 micrometers, at most 4 micrometers, at most 2 micrometers, and/or at most 1 micrometer.

The positioning at 210 may be performed utilizing any suitable structure. As examples, the positioning at 210 may be performed, facilitated, and/or controlled by electrically actuated positioning assembly 70 and/or controller 60 of FIG. 1.

The positioning at 210 may be performed with any suitable timing and/or sequence during methods 200. As examples, the positioning at 210 may be performed prior to the conveying at 220, prior to the detecting at 230, prior to the changing at 240, at least partially concurrently with the changing at 240, as part of the changing at 240, prior to the displaying at 250, prior to the extracting at 260, and/or prior to the optically testing at 270.

Conveying the optical signal at 220 may include conveying any suitable optical signal, which also may be referred to herein as and/or may be an input optical signal, from the optical probe to the calibration structure. In some examples, the optical signal may include and/or be an infrared (IR) optical signal and/or a visible spectrum optical signal. In these examples, the conveying at 220 may include conveying the IR optical signal and/or the visible spectrum optical signal from the optical probe to the calibration structure. As discussed, the gap may spatially separate the optical probe and the calibration structure. With this in mind, the conveying at 220 may include conveying the optical signal across the gap and/or conveying the optical signal from the optical probe to the calibration structure via the gap.

The conveying at 220 may be performed with any suitable timing and/or sequence during methods 200. As examples, the conveying at 220 may be performed subsequent to the positioning at 210, at least partially concurrently with the positioning at 210, prior to the detecting at 230, at least partially concurrently with the detecting at 230, during the detecting at 230, prior to the changing at 240, at least partially concurrently with the changing at 240, during the changing at 240, prior to the displaying at 250, at least partially concurrently with the displaying at 250, prior to the extracting at 260, and/or prior to the optically testing at 270.

Detecting the signal intensity at 230 may include detecting any suitable signal intensity of the optical signal. This may include detecting the signal intensity received by, or as received by, the calibration structure and/or detecting the signal intensity emitted from, or as emitted from, the calibration structure. In some examples, this may include directly detecting the signal intensity of the optical signal. In some examples, this may include detecting the intensity of a fraction, portion, or a coupled portion of the optical signal that couples to the calibration structure, that is conveyed into and/or within the calibration structure, and/or that is emitted from the calibration structure. The portion of the optical signal that is emitted from the calibration structure also may be referred to herein as an output optical signal.

In some examples, the calibration structure may include and/or be an optical detector. In these examples, the detecting at 230 may include detecting with, via, and/or utilizing the calibration structure. In other examples, the optical detector may be separate and/or spaced-apart from the calibration structure. In these examples, the detecting at 230 may include conveying a suitable optical signal, such as the output optical signal, to the optical detector with, via, and/or utilizing the calibration structure; and the detecting at 230 further may include detecting with, via, and/or utilizing the optical detector. Examples of the optical detector are disclosed herein with reference to optical detector 50 of FIG. 1.

In some examples, the detecting at 230 further may include generating a signal intensity output that is indicative of and/or based upon the signal intensity. The signal intensity output may be generated by the calibration structure, may be generated by the optical detector, and/or may be an electrical signal intensity output that takes the form of an electric signal.

The detecting at 230 may be performed with any suitable timing and/or sequence during methods 200. As examples, the detecting at 230 may be performed subsequent to the positioning at 210, at least partially concurrently with the conveying at 220, during the conveying at 220, responsive to the conveying at 220, prior to, at least partially concurrently with, and/or during the changing at 240 and/or the displaying at 250, prior to the extracting at 260, and/or prior to the optically testing at 270.

Changing the relative orientation at 240 may include changing a relative orientation between the optical probe and the calibration structure. The changing at 240 may include changing the relative orientation to produce, to generate, and/or to collect data that is indicative of a representation, or a three-dimensional representation, of the signal intensity as a function of the relative orientation between the optical probe and the calibration structure.

Figure 6:
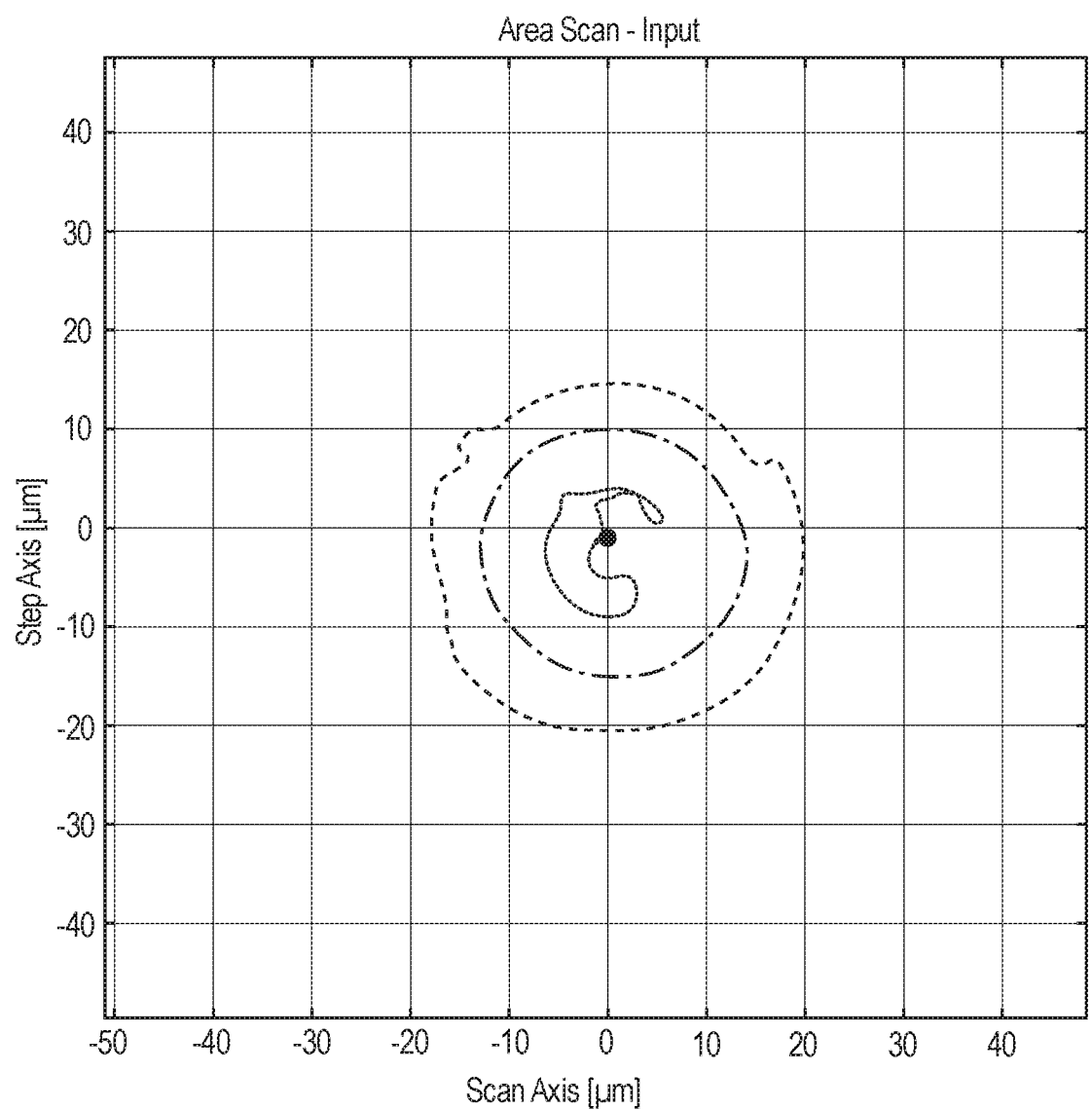
FIG. 6 is an example of a representation of signal intensity as a function of the relative orientation between an optical probe and a calibration structure, according to the present disclosure.

With the above in mind, FIG. 6 illustrates an example of a representation, in the form of a two-dimensional representation, of signal intensity as a function of the relative orientation between the optical probe and the calibration structure for a fixed, or at least substantially fixed, gap magnitude. Stated another way and as an example, FIG. 6 illustrates a representation that may be created by performing the changing at 240 within the Y-Z plane of FIG. 1. In FIG. 6, the dashed contour lines depict relative orientations with a first constant signal intensity, dash-dot contour lines depict relative orientations with a second constant signal intensity, and dotted contour lines depict relative orientations with a third constant signal intensity. The first constant signal intensity is less than the second constant signal intensity, which is less than the third constant signal intensity, and the central circle depicts relative orientation with, or within, a maximum signal intensity.

Figure 7:
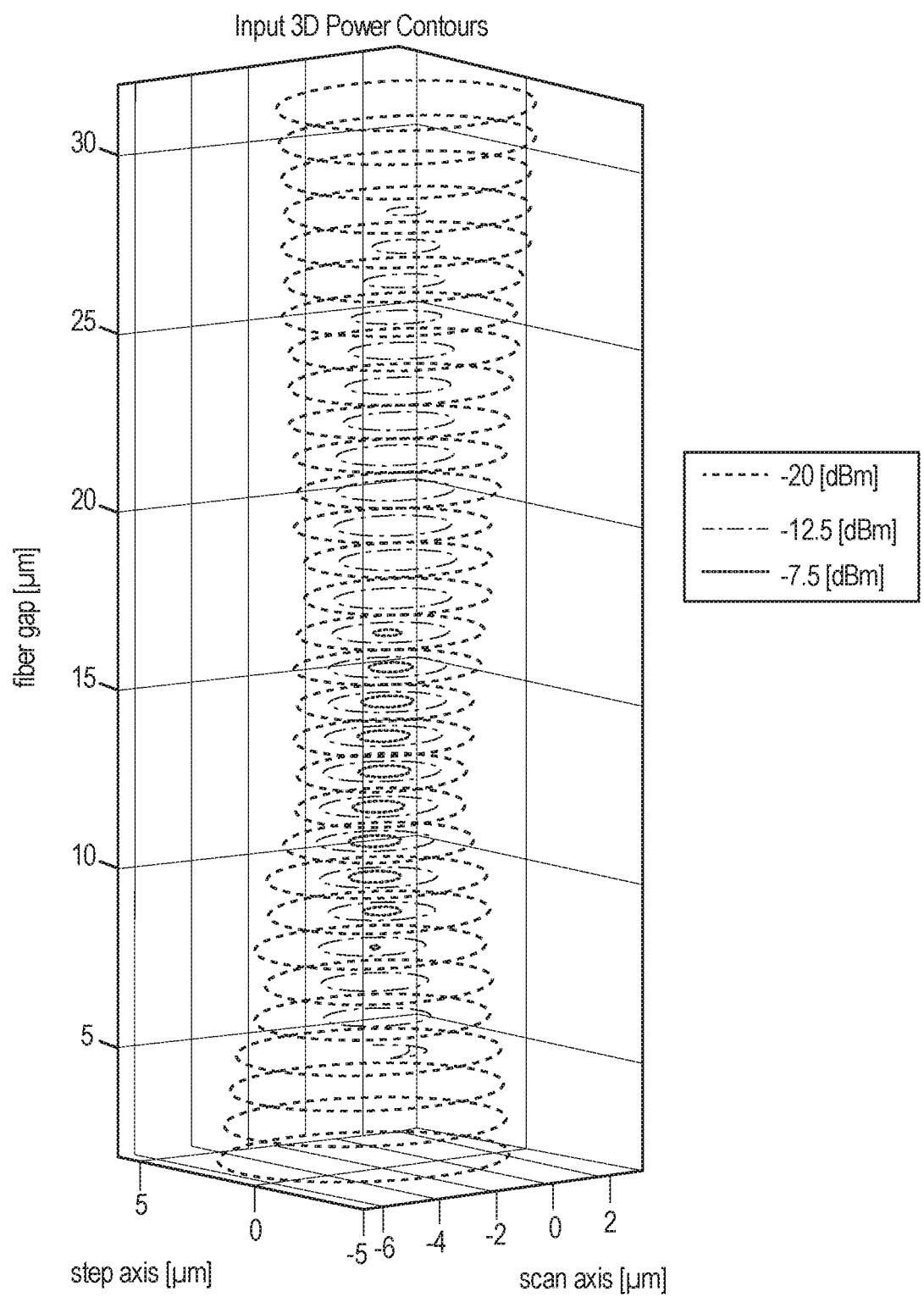
FIG. 7 is an example of a representation of signal intensity as a function of the relative orientation between an optical probe and a calibration structure, according to the present disclosure.

Contour lines generated at a plurality of different, or distinct, gap magnitudes may be combined to generate a representation of signal intensity as a function of the relative orientation between the optical probe and the calibration structure. An example of such a representation is illustrated in FIG. 7, where the vertical axis indicates gap spacing (e.g., the X-axis in FIG. 1) and the horizontal axes indicate relative orientation within a plane (e.g., the Y- and Z-axes of FIG. 1).

The changing at 240 may be accomplished in any suitable manner. As examples, the changing at 240 may include moving the optical probe relative to the calibration structure and/or moving the calibration structure relative to the optical probe. The changing at 240 may be performed utilizing any suitable structure, such as electrically actuated positioning assembly 70 and/or controller 60 of FIG. 1.

In some examples, the changing at 240 may include moving the optical probe and/or the calibration structure to a plurality of spaced-apart, or distinct, relative orientations. In these examples, the detecting at 230 may include detecting the signal intensity while the optical probe and the calibration structure are positioned in at least a subset, or even all, of the plurality of spaced-apart, or distinct, relative orientations. Stated another way, the representation may describe signal intensity at the plurality of spaced-apart, or distinct, relative orientations between the optical probe and the calibration structure. The plurality of spaced-apart, or distinct, relative orientations may extend in two dimensions, as illustrated in FIG. 6, and/or in three dimensions, as illustrated in FIG. 7.

In some examples, the changing at 240 may include scanning, or raster scanning, the optical probe and/or the calibration structure relative to one another in two dimensions and within a first scan plane to generate a correlation between signal intensity and position within the first scan plane. As an example, the scanning may include scanning in the Y-Z plane of FIG. 1. As additional examples, the scanning may include scanning in the X-Y or in the X-Z planes of FIG. 1. An example of the correlation between signal intensity and position within the first scan plane is illustrated in FIG. 6.

In these examples, the changing at 240 also may include moving the optical probe and/or the calibration structure relative to one another in a third dimension that is perpendicular, or at least substantially perpendicular, to the first scan plane. As an example, the moving may include moving in the X-direction of FIG. 1. Also in these examples, the changing at 240 may include repeating the scanning, subsequent to the moving, to generate the correlation between signal intensity and position within a second scan plane that is spaced-apart from the first scan plane. As additional examples, the moving may include moving in the Y or Z directions of FIG. 1. In one specific example, the scanning may include scanning in the X-Y plane and the moving may include moving in the Z-direction. In another specific example, the scanning may include scanning in the X-Z plane and the moving may include moving in the Y-direction. Complementary methods for maintaining gap spacing between an optical probe of probe systems and an optical device are disclosed in U.S. patent application Ser. No. 16/914,913, the complete disclosure of which is hereby incorporated by reference.

Also in these examples, the changing at 240 may include repeatedly preforming the moving and the repeating the scanning to generate a correlation between signal intensity and position within a plurality of spaced-apart, parallel, and/or non-coplanar scan planes. Examples of the correlation between signal intensity and position within a plurality of spaced-apart, parallel, and/or non-coplanar scan planes are illustrated in FIG. 7 as variations in the contour maps that are spaced-apart along the vertical, or fiber gap, dimension.

In some examples, the conveying at 220 may include conveying the optical signal from the probe to the calibration structure along a signal axis, such as signal axis 45 and/or waveguide signal axis 46 of FIG. 1. In these examples, the third dimension may be parallel, or at least substantially parallel, to the signal axis.

The changing at 240 may be performed with any suitable timing and/or sequence during methods 200. As examples, the changing at 240 may be performed subsequent to the positioning at 210, subsequent to, at least partially concurrently with, and/or during the conveying at 220, the detecting at 230, and/or the displaying at 250, prior to the extracting at 260, and/or prior to the optically testing at 270.

Displaying the representation at 250 may include displaying any suitable representation of signal intensity as the function of relative orientation between the optical probe and the calibration structure. Examples of the representation are illustrated in FIGS. 6-7. This may include displaying the representation to an operator of the probe system. The displaying at 250 may include displaying in any suitable manner, including those illustrated in FIGS. 6-7. The displaying at 250 may include displaying with, via, and/or utilizing any suitable structure, such as display 66 of FIG. 1.

In some examples, and as illustrated in FIG. 6, the representation may include and/or be a two-dimensional representation of signal intensity as the function of relative orientation between the optical probe and the calibration structure. Such a two-dimensional representation may describe variations in signal intensity within a plane. In some examples, and as illustrated in FIG. 7, the representation may include and/or be a three-dimensional representation of signal intensity as the function of relative orientation between the optical probe and the calibration structure. Such three-dimensional representations may describe variations in signal intensity in three dimensions.

As discussed herein, FIGS. 6-7 utilize contour lines to visually depict variations in signal intensity as a function of position. However, other depictions of such variations also are within the scope of the present disclosure. As an example, three-dimensional volumes may be utilized to depict variations in signal intensity instead of, or in addition to, contour lines. As another example, various cross-sectional views of such contour lines and/or three-dimensional volume views also are within the scope of the present disclosure.

The displaying at 250 may be performed with any suitable timing and/or sequence during methods 200. As examples, the displaying at 250 may be performed subsequent to, at least partially concurrently with, and/or during the positioning at 210, the conveying at 220, the detecting at 230, and/or the changing at 240.

Extracting the optical property at 260 may include calculating, determining, and/or estimating any suitable optical property that describes optical coupling between the optical probe and the calibration structure and may be performed in any suitable manner. Examples of the suitable optical property include a focal length of the optical probe, a working distance for the optical probe, a numerical aperture of the optical probe, a beam waist location of the optical signal, a beam waist dimension of the optical signal, a divergence angle of the optical signal, a fluence of the optical signal, and/or an astigmatism of the optical probe.

The extracting at 260 may be based, at least in part, on the signal intensity of the optical signal, as detected during the detecting at 230, and/or on a variation in the signal intensity of the optical signal as a function of relative orientation between the optical probe and the calibration structure. Stated another way, the extracting at 260 may include extracting the optical property from and/or based upon the data that is indicative of the three-dimensional representation of the signal intensity as the function of relative orientation between the optical probe and the calibration structure.

As an example, the extracting at 260 may include extracting contour lines for a given signal intensity and/or for a given set of signal intensities. The contour lines may represent relative orientations between the optical probe and the calibration structure where the signal intensity exhibits the given signal intensity. Stated another way, the contour lines may represent relative orientations between the optical probe and the calibration structure where the signal intensity is constant and/or equal to a fixed value. The contour lines may be extracted, for example, for a plurality of distances between the optical probe and the calibration structure and/or may be utilized to visually represent optical coupling between the optical probe and the calibration structure, such as may be displayed during the displaying at 250. Stated another way, the displaying at 250 may include displaying a three-dimensional map of contour lines that may be extracted and/or determined during the extracting at 260.

As another example, the extracting at 260 may include mathematically analyzing and/or modeling the variation in the signal intensity of the optical signal as the function of relative orientation between the optical probe and the calibration structure to calculate and/or determine one or more parameters and/or metrics of the optical coupling between the optical probe and the calibration structure. Examples of the parameters and/or metrics include a focal distance of the optical probe, a focal distance of the combination of the optical probe and the calibration structure, a beam diameter of the optical signal, a beam diameter of the optical signal as a function of location within the gap between the optical probe and the calibration structure, a numerical aperture of the optical probe, a numerical aperture of a lens of the optical probe, an astigmatism of the optical probe, an astigmatism of the lens of the optical probe, and/or a beam quality factor ($M^2$) of the optical signal.

Optically testing the device under test at 270 may include optically testing the DUT with, via, and/or utilizing the probe system. When methods 200 include the optically testing at 270, the optically testing at 270 may be performed subsequent to the positioning at 210, the conveying at 220, the detecting at 230, the changing at 240, the displaying at 250, and/or the extracting at 260. Stated another way, methods 200 may be utilized to generate the representation of the signal intensity as the function of relative orientation between the optical probe and the calibration structure and/or to extract optical properties prior to performing the optically testing at 270. With this in mind, the representation and/or the optical property may be utilized during and/or to improve the optically testing at 270.

As an example, the optically testing at 270 may include selecting an initial relative orientation between the optical probe and the DUT based, at least in part, on the representation and/or on the optical property. Such methods may be utilized to decrease and/or minimize insertion loss due to the optical coupling between the optical probe and the DUT. Additionally or alternatively, such methods may be utilized to quantify the insertion loss and/or to account for, or quantify, variability among optical probes that may be utilized by the probe system.

As another example, the optically testing at 270 may include quantifying optical performance of the DUT based, at least in part, on the optically testing and also on the representation and/or the optical property. Such methods may be utilized to quantify, to deconvolute, and/or to separate contributions to changes in the optical signal that is utilized during the optically testing, which may be caused by optical coupling between the optical probe and the DUT, from changes in the optical signal that may be caused by the DUT itself.

Methods 200 may be performed in any suitable manner and/or utilizing any suitable structure. Examples of structures that may be utilized to perform methods 200 and/or of ways in which these structures may be utilized to perform methods 200 are discussed herein with reference to probe system 10 of FIGS. 1-4.

In one example, and as illustrated in FIG. 1, the calibration structure may include a device optical fiber. The device optical fiber may be configured to receive the optical signal from the optical probe. In some such examples, the optical probe may include and/or be a first optical probe of the probe system, and the device optical fiber may include and/or be a second optical probe of the probe system. In some such examples, the probe system may include the optical detector, and the device optical fiber may be configured to convey the optical signal, or a coupled portion of the optical signal, to the optical detector.

In this example, the positioning at 210 may include positioning the optical probe and the device optical fiber relative to one another. Also in this example, the conveying at 220 may include conveying the optical signal from the optical probe to the device optical fiber, such as along a waveguide signal axis, and/or the detecting at 230 may include detecting the optical signal, or the coupled portion of the optical signal, with the optical detector of the probe system. Also in this example, the changing at 240 may include changing the relative orientation between the optical probe and the device optical fiber, such as by moving the optical probe relative to the device optical fiber and/or moving the device optical fiber relative to the optical probe.

In another example, and as illustrated in FIGS. 1-2, the calibration structure may include a first grating coupler, a second grating coupler, and a waveguide. In this example, the probe system may include the first probe and the second probe. Also in this example, the first grating coupler may be configured to receive the optical signal, or a coupled portion of the optical signal, from the first optical probe and/or to convey the optical signal to the waveguide. The waveguide may be configured to receive the optical signal, or the coupled portion of the optical signal, and to convey the optical signal to the second grating coupler. The second grating coupler may be configured to receive the optical signal, or the coupled portion of the optical signal, from the waveguide and/or to convey the optical signal to the second optical probe. Also in this example, the probe system may include the optical detector, and the second optical probe may be configured to convey the optical signal, or the coupled portion of the optical signal, to the optical detector.

In this example, the positioning at 210 may include positioning the first optical probe relative to the first grating coupler and/or positioning the second optical probe relative to the second grating coupler. Also in this example, the conveying at 220 may include conveying the optical signal, or the coupled portion of the optical signal, from the first optical probe to the optical detector via the first grating coupler, the waveguide, the second grating coupler, and the second optical probe. The conveying the optical signal from the first optical probe to the first grating coupler may include conveying along a signal axis. Also in this example, the detecting at 230 may include detecting the optical signal, or the coupled portion of the optical signal, with the optical detector of the probe system. Also in this example, the changing at 240 may include changing the relative orientation between the first optical probe and the first grating coupler, such as by moving the first optical probe relative to the first grating coupler and/or moving the first grating coupler relative to the first optical probe.

In another example, and as illustrated in FIGS. 1 and 3, the calibration structure may include a waveguide. In this example, the probe system may include the first probe and the second probe. Also in this example, the waveguide may be configured to receive the optical signal, or a coupled portion of the optical signal, from the first optical probe and/or to convey the optical signal to the second optical probe. The waveguide may be accessible to the first optical probe and/or to the second optical probe via a vertical surface of a substrate that includes the calibration structure and/or may extend at least substantially parallel to an upper surface of the substrate. Examples of the vertical surface include a substrate edge of the substrate and/or a trench that may be defined within the substrate. The optical signal may be conveyed from the first optical probe to the waveguide along a waveguide signal axis. Also in this example, the probe system may include the optical detector, and the second optical probe may be configured to convey the optical signal, or the coupled portion of the optical signal, to the optical detector.

In this example, the positioning at 210 may include positioning the first optical probe relative to the waveguide, or to a first end of the waveguide, and/or positioning the second optical probe relative to the waveguide, or to a second, opposed, end of the waveguide. Also in this example, the conveying at 220 may include conveying the optical signal, or the coupled portion of the optical signal, from the first optical probe to the optical detector via the waveguide and the second optical probe. Also in this example, the detecting at 230 may include detecting the optical signal, or the coupled portion of the optical signal, with the optical detector of the probe system. Also in this example, the changing at 240 may include changing the relative orientation between the first optical probe and the waveguide, such as by moving the first optical probe relative to the waveguide and/or moving the waveguide relative to the first optical probe.

In another example, and as illustrated in FIGS. 1 and 4, the calibration structure may include an obstructive calibration structure in the form of a knife-edge calibration structure. In this example, the probe system and/or the calibration structure may include the optical detector, and the knife-edge calibration structure and the optical detector may be positioned, relative to one another, such that the optical detector extends around an external periphery of the knife-edge calibration structure and/or such that the knife-edge calibration structure blocks the optical signal from being incident upon a region of the optical detector that is internal to the external periphery of the knife-edge calibration structure but permits the optical signal to be incident upon a region of the optical detector that extends around, or external to, the external periphery of the knife-edge calibration structure.

In this example, the positioning at 210 may include positioning the optical probe relative to the knife-edge calibration structure. Also in this example, the conveying at 220 may include conveying the optical signal from the optical probe to the optical detector while selectively blocking a portion of the optical signal from being incident upon the optical detector with, via, and/or utilizing the knife-edge calibration structure. Also in this example, the detecting at 230 may include detecting the optical signal, or a fraction of the optical signal that reaches the optical detector, with the optical detector.

Also in this example, the changing at 240 may include changing the relative orientation between the optical probe and the combination of the knife-edge calibration structure and the optical detector, such as by moving the optical probe relative to the knife-edge calibration structure and also relative to the optical detector and/or moving the knife-edge calibration structure and the optical detector relative to the optical probe. More specifically, the changing at 240 may include scanning the optical signal across the optical detector and also across the knife-edge calibration structure, such as along a plurality of different scan directions. The scanning the optical signal across the optical detector and also across the knife-edge calibration structure along the plurality of different scan directions may be utilized to generate a corresponding plurality of one-dimensional representations of signal intensity as a function of relative orientation and scan direction. These methods further may include utilizing the plurality of one-dimensional representations of signal intensity as the function of relative orientation and scan direction to generate the representation of the intensity as the function of relative orientation between the optical probe and the combination of the knife-edge calibration structure and the optical detector.

In another example, and as illustrated in FIGS. 1 and 4, the calibration structure may include an obstructive calibration structure in the form of a pinhole calibration structure. In this example, the probe system and/or the calibration structure may include the optical detector, and the optical probe, the pinhole calibration structure, and the optical detector may be positioned, relative to one another, such that the optical detector is incident upon the optical detector via the pinhole calibration structure, or via a pinhole of the pinhole calibration structure.

In this example, the positioning at 210 may include positioning the optical probe relative to the pinhole calibration structure. Also in this example, the conveying at 220 may include conveying the optical signal from the optical probe to the optical detector while selectively blocking a portion of the optical signal from being incident upon the optical detector with, via, and/or utilizing the pinhole structure. Also in this example, the detecting at 230 may include detecting the optical signal, or a fraction of the optical signal that reaches the optical detector, with the optical detector.

Also in this example, the changing at 240 may include changing the relative orientation between the optical probe and the combination of the pinhole calibration structure and the optical detector, such as by moving the optical probe relative to the pinhole calibration structure and also relative to the optical detector and/or moving the pinhole calibration structure and the optical detector relative to the optical probe. More specifically, the changing at 240 may include scanning the optical signal across the optical detector and also across the pinhole calibration structure, such as along a plurality of different scan directions in a manner that may be at least substantially similar to that discussed herein with reference to the knife-edge calibration structure. The scanning the optical signal across the optical detector and also across the pinhole calibration structure along the plurality of different scan directions may be utilized to generate a corresponding plurality of one-dimensional representations of signal intensity as a function of relative orientation and scan direction. These methods further may include utilizing the plurality of one-dimensional representations of signal intensity as the function of relative orientation and scan direction to generate the representation of the intensity as the function of relative orientation between the optical probe and the combination of the pinhole calibration structure and the optical detector.

As used herein, the phrase "optical signal" may refer to any suitable signal that is transferred and/or conveyed via photons. Optical signals, according to the present disclosure, may include photons of any wavelength, such as may be suitable for receipt by, detection by, transmission by, and/or emission from DUTs 150 and/or calibration structures 160. Examples of optical signals include laser light and/or electromagnetic radiation. Additional examples of optical signals include x-ray radiation, ultraviolet radiation, visible light, infrared radiation, and/or microwave radiation.

In the present disclosure, several of the illustrative, non-exclusive examples have been discussed and/or presented in the context of flow diagrams, or flow charts, in which the methods are shown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order and/or concurrently. It is also within the scope of the present disclosure that the blocks, or steps, may be implemented as logic, which also may be described as implementing the blocks, or steps, as logics. In some applications, the blocks, or steps, may represent expressions and/or actions to be performed by functionally equivalent circuits or other logic devices. The illustrated blocks may, but are not required to, represent executable instructions that cause a computer, processor, and/or other logic device to respond, to perform an action, to change states, to generate an output or display, and/or to make decisions.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entities in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C," and "A, B, and/or C" may mean A alone, B alone, C alone, A and B together, A and C together, B and C together, A, B, and C together, and optionally any of the above in combination with at least one other entity.

In the event that any patents, patent applications, or other references are incorporated by reference herein and (1) define a term in a manner that is inconsistent with and/or (2) are otherwise inconsistent with, either the non-incorporated portion of the present disclosure or any of the other incorporated references, the non-incorporated portion of the present disclosure shall control, and the term or incorporated disclosure therein shall only control with respect to the reference in which the term is defined and/or the incorporated disclosure was present originally.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

As used herein, "at least substantially," when modifying a degree or relationship, may include not only the recited "substantial" degree or relationship, but also the full extent of the recited degree or relationship. A substantial amount of a recited degree or relationship may include at least 75% of the recited degree or relationship. For example, an object that is at least substantially formed from a material includes objects for which at least 75% of the objects are formed from the material and also includes objects that are completely formed from the material. As another example, a first length that is at least substantially as long as a second length includes first lengths that are within 75% of the second length and also includes first lengths that are as long as the second length.

Illustrative, non-exclusive examples of systems and methods according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. A method of characterizing optical coupling between an optical probe of a probe system and a calibration structure, the method comprising:
 positioning the optical probe and the calibration structure proximate one another;
 conveying an optical signal from the optical probe to the calibration structure;
 during the conveying, detecting a signal intensity of the optical signal optionally at least one of received by the calibration structure and emitted from the calibration structure; and
 during the conveying and also during the detecting, changing a relative orientation between the optical probe and the calibration structure to generate a representation, and optionally at least one of a two-dimensional representation and a three-dimensional representation, of the signal intensity as a function of the relative orientation between the optical probe and the calibration structure.

A2. The method of paragraph A1, wherein the positioning includes positioning such that a gap, or an air gap, spatially separates the optical probe and the calibration structure.

A3. The method of any of paragraphs A1-A2, wherein the positioning includes positioning such that a distance, or a/the gap, between the optical probe and the calibration structure is at least one of:
 (i) at least 0.1 micrometer, at least 0.25 micrometers, at least 0.5 micrometers, at least 0.75 micrometers, at least 1 micrometer, at least 2 micrometers, at least 3 micrometers, at least 4 micrometers, at least 5 micrometers, at least 7.5 micrometers, at least 10 micrometers, at least 15 micrometers, at least 20 micrometers, at least 25 micrometers, at least 30 micrometers, at least 40 micrometers; and
 (ii) at most 100 micrometers, at most 75 micrometers, at most 50 micrometers, at most 25 micrometers, at most 20 micrometers, at most 15 micrometers, at most 10 micrometers, at most 8 micrometers, at most 6 micrometers, at most 4 micrometers, at most 2 micrometers, or at most 1 micrometer.

A4. The method of any of paragraphs A1-A3, wherein the conveying the optical signal includes conveying at least one of an infrared optical signal and a visible spectrum optical signal from the optical probe to the calibration structure.

A5. The method of any of paragraphs A1-A4, wherein the conveying the optical signal includes conveying the optical signal across a/the gap, or an/the air gap, that spatially separates the optical probe and the calibration structure.

A6. The method of any of paragraphs A1-A5, wherein the detecting includes at least one of:
 (i) detecting the signal intensity with the calibration structure; and
 (ii) conveying the optical signal to an optical detector, via the calibration structure, and further wherein the detecting the signal intensity includes detecting with the optical detector.

A7. The method of any of paragraphs A1-A6, wherein the detecting includes generating a signal intensity output indicative of the signal intensity, optionally wherein the signal intensity output is an electrical signal intensity output.

A8. The method of any of paragraphs A1-A7, wherein the changing includes at least one, and optionally only one, of:
 (i) moving the optical probe relative to the calibration structure; and
 (ii) moving the calibration structure relative to the optical probe.

A9. The method of any of paragraphs A1-A8, wherein the changing includes moving the optical probe and the calibration structure to a plurality of spaced-apart, or distinct, relative orientations.

A10. The method of any of paragraphs A1-A9, wherein the changing includes:

(i) scanning, or raster scanning, the optical probe and the calibration structure relative to one another in two dimensions and within a first scan plane to generate a correlation between signal intensity and position within the first scan plane;

(ii) moving the optical probe and the calibration structure relative to one another in a third dimension that is perpendicular, or at least substantially perpendicular, to the first scan plane; and (iii) repeating the scanning to generate the correlation between signal intensity and position within a second scan plane that is spaced-apart from the first scan plane.

A11. The method of paragraph A10, wherein the method includes repeatedly performing the moving and the repeating the scanning to generate the correlation between signal intensity and position within a plurality of spaced-apart, and optionally parallel, and optionally non-coplanar, scan planes.

A12. The method of any of paragraphs A10-A11, wherein the conveying the optical signal includes conveying the optical signal from the optical probe to the calibration structure along a signal axis, and further wherein the third dimension is parallel, or at least substantially parallel, to the signal axis.

A13. The method of any of paragraphs A1-A12, wherein the representation describes signal intensity at a plurality of spaced-apart relative orientations between the optical probe and the calibration structure.

A14. The method of paragraph A13, wherein the plurality of spaced-apart relative orientations extend in three dimensions.

A15. The method of any of paragraphs A1-A14, wherein the optical probe includes one of:

(i) an optical fiber;
(ii) a cleaved optical fiber;
(iii) a lensed optical fiber; and
(iv) a faceted optical fiber.

A16. The method of any of paragraphs A1-A15, wherein the optical probe includes a fiber optic cable.

A17. The method of any of paragraphs A1-A16, wherein the method further includes displaying the representation of signal intensity as the function of relative orientation between the optical probe and the calibration structure to an operator of the probe system.

A18. The method of any of paragraphs A1-A17, wherein the method further includes optically testing a device under test (DUT), and further wherein the optically testing includes selecting an initial relative orientation between the optical probe and the DUT based, at least in part, on the representation of signal intensity as the function of relative orientation between the optical probe and the calibration structure.

A19. The method of any of paragraphs A1-A18, wherein the method further includes optically testing a/the DUT, wherein the optically testing includes quantifying optical performance of the DUT based, at least in part, on the optically testing and also on the representation of signal intensity as the function of relative orientation between the optical probe and the calibration structure.

A20. The method of any of paragraphs A1-A19, wherein the calibration structure includes a device optical fiber configured to receive the optical signal from the optical probe, optionally wherein the optical probe is a first optical probe, and further optionally wherein the device optical fiber is a second optical probe.

A21. The method of paragraph A20, wherein the probe system includes an/the optical detector, wherein the device optical fiber is configured to convey a coupled portion of the optical signal to the optical detector, and further wherein the detecting includes detecting with the optical detector.

A22. The method of any of paragraphs A1-A19, wherein the calibration structure includes:

(i) a first grating coupler configured to receive a coupled portion of the optical signal from the optical probe;

(ii) a waveguide configured to receive the coupled portion of the optical signal from the first grating coupler; and (iii) a second grating coupler configured to receive the coupled portion of the optical signal from the waveguide.

A23. The method of paragraph A22, wherein the probe system further includes an/the optical detector configured to receive the coupled portion of the optical signal from the second grating coupler, wherein the detecting includes detecting with the optical detector.

A24. The method of paragraph A23, wherein the optical probe is a first optical probe, wherein the probe system further includes a second optical probe, wherein the second optical probe is configured to receive the coupled portion of the optical signal from the second grating coupler and to convey the coupled portion of the optical signal to the optical detector.

A25. The method of any of paragraphs A1-A19, wherein the calibration structure includes a waveguide configured to receive a coupled portion of the optical signal from the optical probe.

A26. The method of paragraph A25, wherein the waveguide at least one of:

(i) is accessible to the optical probe via an edge of a substrate that includes the calibration structure; and (ii) is accessible to the optical probe via a trench that extends into the substrate; and (iii) extends at least substantially parallel to an upper surface of the substrate.

A27. The method of any of paragraphs A25-A26, wherein the probe system further includes an/the optical detector configured to receive the coupled portion of the optical signal from the waveguide, wherein the detecting includes detecting with the optical detector.

A28. The method of paragraph A27, wherein the optical probe is a first optical probe, wherein the probe system further includes a second optical probe, wherein the second optical probe is configured to receive the coupled portion of the optical signal from the waveguide and to convey the coupled portion of the optical signal to the optical detector.

A29. The method of any of paragraphs A1-A19, wherein the calibration structure includes a knife-edge calibration structure, wherein the probe system includes an optical detector, and further wherein the detecting includes detecting with the optical detector.

A30. The method of paragraph A29, wherein the knife-edge calibration structure and the optical detector are positioned such that the optical detector extends around a periphery of the knife-edge calibration structure.

A31. The method of any of paragraphs A29-A30, wherein the changing includes scanning the optical signal across the optical detector, and also across the knife-edge calibration structure, along a plurality of different scan directions, to generate a corresponding plurality of one-dimensional representations of signal intensity as a function of relative orientation and scan direction.

A32. The method of paragraph A31, wherein the method includes utilizing the plurality of one-dimensional representations of signal intensity as the function of relative orientation and scan direction to generate the representation of the signal intensity as the function of relative orientation between the optical probe and the knife-edge calibration structure.

A33. The method of any of paragraphs A1-A32, wherein the calibration structure includes a pinhole calibration structure, wherein the probe system includes an optical detector, and further wherein the detecting includes detecting with the optical detector.

A34. The method of paragraph A33, wherein the pinhole calibration structure and the optical detector are positioned such that the optical signal is incident upon the optical detector via the pinhole calibration structure.

A35. The method of any of paragraphs A33-A34, wherein the changing includes scanning the optical signal across the optical detector, and also across the pinhole calibration structure, along a plurality of different scan directions, to generate a corresponding plurality of one-dimensional representations of signal intensity as a function of relative orientation and scan direction.

A36. The method of paragraph A35, wherein the method includes utilizing the plurality of one-dimensional representations of signal intensity as the function of relative orientation and scan direction to generate the representation of the signal intensity as the function of relative orientation between the optical probe and the pinhole calibration structure.

A37. The method of any of paragraphs A1-A36, wherein the method further includes extracting an optical property that describes optical coupling between the optical probe and the calibration structure.

A38. The method of paragraph A37, wherein the optical property includes at least one of:
(i) a focal length of the optical probe;
(ii) a working distance for the optical probe;
(iii) a numerical aperture of the optical probe;
(iv) a beam waist location of the optical signal;
(v) a beam waist dimension of the optical signal;
(vi) a divergence angle of the optical signal;
(vii) a fluence of the optical signal; and
(viii) an astigmatism of the optical probe.

B1. A probe system, comprising:
a probe assembly including an optical probe;
a support surface configured to support a substrate that includes a device under test (DUT) that includes an optical device;
a signal generation and analysis assembly configured to generate an optical signal and to provide the optical signal to the optical device via the optical probe;
an electrically actuated positioning assembly configured to selectively adjust a relative orientation between the optical probe and the DUT;
a calibration structure configured to receive the optical signal;
an optical detector configured to detect a signal intensity of the optical signal optionally at least one of received by the calibration structure and emitted from the calibration structure; and
a controller programmed to control the operation of the probe system according to the method of any of paragraphs A1-A38.

C1. Non-transitory computer-readable storage media including computer-readable instructions that, when executed, direct a probe system to perform the method of any of paragraphs A1-A38.

D1. A probe system, comprising:
a probe assembly including an optical probe;
a support surface configured to support a substrate that includes a device under test (DUT) that includes an optical device;
a signal generation and analysis assembly configured to generate an optical signal and to provide the optical signal to the optical device via the optical probe;
an electrically actuated positioning assembly configured to selectively adjust a relative orientation between the optical probe and the DUT;
a calibration structure configured to receive the optical signal;
an optical detector configured to detect a signal intensity of the optical signal optionally at least one of received by the calibration structure and emitted from the calibration structure; and
a controller programmed to control the operation of the probe system by:
(i) positioning, optionally with the electrically actuated positioning assembly, the optical probe and the calibration structure proximate one another;
(ii) conveying the optical signal from the optical probe to the calibration structure;
(iii) during the conveying, detecting, optionally with the optical detector, the signal intensity of the optical signal; and
(iv) during the conveying and also during the detecting, changing the relative orientation between the optical probe and the calibration structure, optionally with the electrically actuated positioning assembly, to generate a representation, and optionally at least one of a two-dimensional representation and a three-dimensional representation, of the signal intensity as a function of the relative orientation between the optical probe and the calibration structure.

D2. The probe system of paragraph D1, wherein the positioning includes positioning such that a gap, or an air gap, spatially separates the optical probe and the calibration structure.

D3. The probe system of any of paragraphs D1-D2, wherein the positioning includes positioning such that a distance, or a/the gap, between the optical probe and the calibration structure is at least one of:
(i) at least 0.1 micrometer, at least 0.25 micrometers, at least 0.5 micrometers, at least 0.75 micrometers, at least 1 micrometer, at least 2 micrometers, at least 3 micrometers, at least 4 micrometers, at least 5 micrometers, at least 7.5 micrometers, at least 10 micrometers, at least 15 micrometers, at least 20 micrometers, at least 25 micrometers, at least 30 micrometers, at least 40 micrometers; and
(ii) at most 100 micrometers, at most 75 micrometers, at most 50 micrometers, at most 25 micrometers, at most 20 micrometers, at most 15 micrometers, at most 10 micrometers, at most 8 micrometers, at most 6 micrometers, at most 4 micrometers, at most 2 micrometers, or at most 1 micrometer.

D4. The probe system of any of paragraphs D1-D3, wherein the conveying the optical signal includes conveying at least one of an infrared optical signal and a visible spectrum optical signal from the optical probe to the calibration structure.

D5. The probe system of any of paragraphs D1-D4, wherein the conveying the optical signal includes conveying the optical signal across a/the gap, or an/the air gap, that spatially separates the optical probe and the calibration structure.

D6. The probe system of any of paragraphs D1-D5, wherein the detecting includes at least one of:
(i) detecting the signal intensity with the calibration structure; and
(ii) conveying the optical signal to the optical detector, via the calibration structure, and further wherein the detecting the signal intensity includes detecting with the optical detector.

D7. The probe system of any of paragraphs D1-D6, wherein the detecting includes generating a signal intensity output indicative of the signal intensity, optionally wherein the signal intensity output is an electrical signal intensity output.

D8. The probe system of any of paragraphs D1-D7, wherein the changing includes at least one, and optionally only one, of:
(i) moving the optical probe relative to the calibration structure; and
(ii) moving the calibration structure relative to the optical probe.

D9. The probe system of any of paragraphs D1-D8, wherein the changing includes moving the optical probe and the calibration structure to a plurality of spaced-apart, or distinct, relative orientations.

D10. The probe system of any of paragraphs D1-D9, wherein the changing includes:
(i) scanning, or raster scanning, the optical probe and the calibration structure relative to one another in two dimensions and within a first scan plane to generate a correlation between signal intensity and position within the first scan plane;
(ii) moving the optical probe and the calibration structure relative to one another in a third dimension that is perpendicular, or at least substantially perpendicular, to the first scan plane; and
(iii) repeating the scanning to generate the correlation between signal intensity and position within a second scan plane that is spaced-apart from the first scan plane.

D11. The probe system of paragraph D10, wherein the controller further is programmed to repeatedly perform the moving and the repeating the scanning to generate the correlation between signal intensity and position within a plurality of spaced-apart, and optionally parallel, and optionally non-coplanar, scan planes.

D12. The probe system of any of paragraphs D10-D11, wherein the conveying the optical signal includes conveying the optical signal from the optical probe to the calibration structure along a signal axis, and further wherein the third dimension is parallel, or at least substantially parallel, to the signal axis.

D13. The probe system of any of paragraphs D1-D12, wherein the representation describes signal intensity at a plurality of spaced-apart relative orientations between the optical probe and the calibration structure.

D14. The probe system of paragraph D13, wherein the plurality of spaced-apart relative orientations extend in three dimensions.

D15. The probe system of any of paragraphs D1-D14, wherein the optical probe includes one of:
(i) an optical fiber;
(ii) a cleaved optical fiber;
(iii) a lensed optical fiber; and
(iv) a faceted optical fiber.

D16. The probe system of any of paragraphs D1-D15, wherein the optical probe includes a fiber optic cable.

D17. The probe system of any of paragraphs D1-D16, wherein the controller further is programmed to display the representation of signal intensity as the function of relative orientation between the optical probe and the calibration structure to an operator of the probe system.

D18. The probe system of any of paragraphs D1-D17, wherein the controller further is programmed to optically test the device under test (DUT) and to select an initial relative orientation between the optical probe and the DUT based, at least in part, on the representation of signal intensity as the function of relative orientation between the optical probe and the calibration structure.

D19. The probe system of any of paragraphs D1-D18, wherein the controller further is programmed to optically test the DUT and to quantify optical performance of the DUT based, at least in part, on the optical test and also on the representation of signal intensity as the function of relative orientation between the optical probe and the calibration structure.

D20. The probe system of any of paragraphs D1-D19, wherein the calibration structure includes a device optical fiber configured to receive the optical signal from the optical probe, optionally wherein the optical probe is a first optical probe, and further optionally wherein the device optical fiber is a second optical probe.

D21. The probe system of paragraph D20, wherein the probe system includes the optical detector, wherein the device optical fiber is configured to convey a coupled portion of the optical signal to the optical detector, and further wherein the detecting includes detecting with the optical detector.

D22. The probe system of any of paragraphs D1-D19, wherein the calibration structure includes:
(i) a first grating coupler configured to receive a coupled portion of the optical signal from the optical probe;
(ii) a waveguide configured to receive the coupled portion of the optical signal from the first grating coupler; and
(iii) a second grating coupler configured to receive the coupled portion of the optical signal from the waveguide.

D23. The probe system of paragraph D22, wherein the probe system further includes the optical detector configured to receive the coupled portion of the optical signal from the second grating coupler, wherein the detecting includes detecting with the optical detector.

D24. The probe system of paragraph D23, wherein the optical probe is a first optical probe, wherein the probe system further includes a second optical probe, wherein the second optical probe is configured to receive the coupled portion of the optical signal from the second grating coupler and to convey the coupled portion of the optical signal to the optical detector.

D25. The probe system of any of paragraphs D1-D19, wherein the calibration structure includes a waveguide configured to receive a coupled portion of the optical signal from the optical probe.

D26. The probe system of paragraph D25, wherein the waveguide at least one of:
(i) is accessible to the optical probe via an edge of the substrate that includes the calibration structure; and
(ii) is accessible to the optical probe via a trench that extends into the substrate; and
(iii) extends at least substantially parallel to an upper surface of the substrate.

D27. The probe system of any of paragraphs D25-D26, wherein the probe system further includes the optical detector configured to receive the coupled portion of the optical signal from the waveguide, wherein the detecting includes detecting with the optical detector.

D28. The probe system of paragraph D27, wherein the optical probe is a first optical probe, wherein the probe system further includes a second optical probe, wherein the second optical probe is configured to receive the coupled portion of the optical signal from the waveguide and to convey the coupled portion of the optical signal to the optical detector.

D29. The probe system of any of paragraphs D1-D19, wherein the calibration structure includes a knife-edge calibration structure.

D30. The probe system of paragraph D29, wherein the knife-edge calibration structure and the optical detector are positioned such that the optical detector extends around a periphery of the knife-edge calibration structure.

D31. The probe system of any of paragraphs D29-D30, wherein the changing includes scanning the optical signal across the optical detector, and also across the knife-edge calibration structure, along a plurality of different scan directions, to generate a corresponding plurality of one-dimensional representations of signal intensity as a function of relative orientation and scan direction.

D32. The probe system of paragraph D31, wherein the controller further is programmed to utilize the plurality of one-dimensional representations of signal intensity as the function of relative orientation and scan direction to generate the representation of the signal intensity as the function of relative orientation between the optical probe and the knife-edge calibration structure.

D33. The probe system of any of paragraphs D1-D32, wherein the calibration structure includes a pinhole calibration structure, and further wherein the detecting includes detecting with the optical detector.

D34. The probe system of paragraph D33, wherein the pinhole calibration structure and the optical detector are positioned such that the optical signal is incident upon the optical detector via the pinhole calibration structure.

D35. The probe system of any of paragraphs D33-D34, wherein the changing includes scanning the optical signal across the optical detector, and also across the pinhole calibration structure, along a plurality of different scan directions, to generate a corresponding plurality of one-dimensional representations of signal intensity as a function of relative orientation and scan direction.

D36. The probe system of paragraph D35, wherein the controller further is programmed to utilize the plurality of one-dimensional representations of signal intensity as the function of relative orientation and scan direction to generate the representation of the signal intensity as the function of relative orientation between the optical probe and the pinhole calibration structure.

D37. The probe system of any of paragraphs D1-D36, wherein the controller further is programmed to extract an optical property that describes optical coupling between the optical probe and the calibration structure.

D38. The probe system of paragraph D37, wherein the optical property includes at least one of:
  (i) a focal length of the optical probe;
  (ii) a working distance for the optical probe;
  (iii) a numerical aperture of the optical probe;
  (iv) a beam waist location of the optical signal;
  (v) a beam waist dimension of the optical signal;
  (vi) a divergence angle of the optical signal;
  (vii) a fluence of the optical signal; and
  (viii) an astigmatism of the optical probe.

E1. The method of any of paragraphs A1-A38, the probe system of paragraph B1, the storage media of paragraph C1, or the probe system of any of paragraphs D1-D38, wherein the calibration structure includes, is, or instead is at least one of an optical calibration structure, an optical structure, and an optically active structure.

INDUSTRIAL APPLICABILITY

The systems and methods disclosed herein are applicable to the optical device manufacturing and test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A probe system, comprising:
  a probe assembly including an optical probe;
  a support surface configured to support a substrate that includes a device under test (DUT) that includes an optical device;
  a signal generation and analysis assembly configured to generate an optical signal and to provide the optical signal to the optical device via the optical probe;
  an electrically actuated positioning assembly configured to selectively adjust a relative orientation between the optical probe and the DUT;
  a calibration structure configured to receive the optical signal;
  an optical detector configured to detect a signal intensity of the optical signal; and
  a controller programmed to control the operation of the probe system by:
    (i) positioning the optical probe and the calibration structure proximate one another;
    (ii) conveying the optical signal from the optical probe to the calibration structure;
    (iii) during the conveying, detecting the signal intensity of the optical signal; and
    (iv) during the conveying and also during the detecting, changing the relative orientation between the optical probe and the calibration structure to generate a representation of the signal intensity as a function of the relative orientation between the optical probe and the calibration structure, wherein the changing includes scanning the optical probe and the calibration structure relative to one another in two dimensions and within a first scan plane to generate a correlation between signal intensity and position within the first scan plane.

2. The probe system of claim 1, wherein the conveying the optical signal includes conveying the optical signal across a gap that spatially separates the optical probe and the calibration structure.

3. The probe system of claim 1, wherein the detecting includes at least one of:
(i) detecting the signal intensity with the calibration structure; and
(ii) conveying the optical signal to the optical detector, via the calibration structure, and further wherein the detecting the signal intensity includes detecting with the optical detector.

4. The probe system of claim 1, wherein the changing further includes:
(i) moving the optical probe and the calibration structure relative to one another in a third dimension that is at least substantially perpendicular to the first scan plane; and
(ii) repeating the scanning to generate the correlation between signal intensity and position within a second scan plane that is spaced-apart from the first scan plane.

5. The probe system of claim 4, wherein the controller further is programmed to repeatedly perform the moving and the repeating the scanning to generate the correlation between signal intensity and position within a plurality of spaced-apart scan planes.

6. The probe system of claim 1, wherein the controller further is programmed to display the representation of signal intensity as the function of relative orientation between the optical probe and the calibration structure to an operator of the probe system.

7. The probe system of claim 1, wherein the controller further is programmed to optically test the device under test (DUT) and to at least one of:
(i) select an initial relative orientation between the optical probe and the DUT based, at least in part, on the representation of signal intensity as the function of relative orientation between the optical probe and the calibration structure; and
(ii) quantify optical performance of the DUT based, at least in part, on the optical test and also on the representation of signal intensity as the function of relative orientation between the optical probe and the calibration structure.

8. The probe system of claim 1, wherein the calibration structure includes a device optical fiber configured to receive the optical signal from the optical probe, and further wherein the device optical fiber is configured to convey a coupled portion of the optical signal to the optical detector.

9. The probe system of claim 1, wherein the calibration structure includes:
(i) a first grating coupler configured to receive a coupled portion of the optical signal from the optical probe;
(ii) a waveguide configured to receive the coupled portion of the optical signal from the first grating coupler; and
(iii) a second grating coupler configured to receive the coupled portion of the optical signal from the waveguide.

10. The probe system of claim 9, wherein the optical detector is configured to receive the coupled portion of the optical signal from the second grating coupler.

11. The probe system of claim 10, wherein the optical probe is a first optical probe, wherein the probe system further includes a second optical probe, wherein the second optical probe is configured to receive the coupled portion of the optical signal from the second grating coupler and to convey the coupled portion of the optical signal to the optical detector.

12. The probe system of claim 1, wherein the calibration structure includes a waveguide configured to receive a coupled portion of the optical signal from the optical probe.

13. The probe system of claim 12, wherein the waveguide at least one of:
(i) is accessible to the optical probe via an edge of the substrate that includes the calibration structure;
(ii) is accessible to the optical probe via a trench that extends into the substrate; and
(iii) extends at least substantially parallel to an upper surface of the substrate.

14. The probe system of claim 12, wherein the optical detector is configured to receive the coupled portion of the optical signal from the waveguide.

15. The probe system of claim 14, wherein the optical probe is a first optical probe, wherein the probe system further includes a second optical probe, wherein the second optical probe is configured to receive the coupled portion of the optical signal from the waveguide and to convey the coupled portion of the optical signal to the optical detector.

16. The probe system of claim 1, wherein the calibration structure includes at least one of:
(i) a knife-edge calibration structure; and
(ii) a pinhole calibration structure.

17. The probe system of claim 1, wherein the controller further is programmed to extract an optical property that describes optical coupling between the optical probe and the calibration structure.

18. The probe system of claim 17, wherein the optical property includes at least one of:
(i) a focal length of the optical probe;
(ii) a working distance for the optical probe;
(iii) a numerical aperture of the optical probe;
(iv) a beam waist location of the optical signal;
(v) a beam waist dimension of the optical signal;
(vi) a divergence angle of the optical signal;
(vii) a fluence of the optical signal; and
(viii) an astigmatism of the optical probe.

19. A method of characterizing optical coupling between an optical probe of a probe system and a calibration structure, the method comprising:
positioning the optical probe and the calibration structure proximate one another;
conveying an optical signal from the optical probe to the calibration structure;
during the conveying, detecting a signal intensity of the optical signal; and
during the conveying and also during the detecting, changing a relative orientation between the optical probe and the calibration structure to generate a representation of the signal intensity as a function of the relative orientation between the optical probe and the calibration structure, wherein the changing includes scanning the optical probe and the calibration structure relative to one another in two dimensions and within a first scan plane to generate a correlation between signal intensity and position within the first scan plane.

20. Non-transitory computer-readable storage media including computer-readable instructions that, when executed, direct a probe system to perform the method of claim 19.

21. A probe system, comprising:
a probe assembly including an optical probe;
a support surface configured to support a substrate that includes a device under test (DUT) that includes an optical device;
a signal generation and analysis assembly configured to generate an optical signal and to provide the optical signal to the optical device via the optical probe;
an electrically actuated positioning assembly configured to selectively adjust a relative orientation between the optical probe and the DUT;
a calibration structure configured to receive the optical signal, wherein the calibration structure includes:
(i) a first grating coupler configured to receive a coupled portion of the optical signal from the optical probe;
(ii) a waveguide configured to receive the coupled portion of the optical signal from the first grating coupler; and
(iii) a second grating coupler configured to receive the coupled portion of the optical signal from the waveguide;
an optical detector configured to detect a signal intensity of the optical signal; and
a controller programmed to control the operation of the probe system by:
(i) positioning the optical probe and the calibration structure proximate one another;
(ii) conveying the optical signal from the optical probe to the calibration structure;
(iii) during the conveying, detecting the signal intensity of the optical signal; and
(iv) during the conveying and also during the detecting, changing the relative orientation between the optical probe and the calibration structure to generate a representation of the signal intensity as a function of the relative orientation between the optical probe and the calibration structure.

22. A probe system, comprising:
a probe assembly including an optical probe;
a support surface configured to support a substrate that includes a device under test (DUT) that includes an optical device;
a signal generation and analysis assembly configured to generate an optical signal and to provide the optical signal to the optical device via the optical probe;
an electrically actuated positioning assembly configured to selectively adjust a relative orientation between the optical probe and the DUT;
a calibration structure configured to receive the optical signal, wherein the calibration structure includes a waveguide configured to receive a coupled portion of the optical signal from the optical probe;
an optical detector configured to detect a signal intensity of the optical signal; and
a controller programmed to control the operation of the probe system by:
(i) positioning the optical probe and the calibration structure proximate one another;
(ii) conveying the optical signal from the optical probe to the calibration structure;
(iii) during the conveying, detecting the signal intensity of the optical signal; and
(iv) during the conveying and also during the detecting, changing the relative orientation between the optical probe and the calibration structure to generate a representation of the signal intensity as a function of the relative orientation between the optical probe and the calibration structure.

23. A probe system, comprising:
a probe assembly including an optical probe;
a support surface configured to support a substrate that includes a device under test (DUT) that includes an optical device;
a signal generation and analysis assembly configured to generate an optical signal and to provide the optical signal to the optical device via the optical probe;
an electrically actuated positioning assembly configured to selectively adjust a relative orientation between the optical probe and the DUT;
a calibration structure configured to receive the optical signal, wherein the calibration structure includes at least one of:
(i) a knife-edge calibration structure; and
(ii) a pinhole calibration structure;
an optical detector configured to detect a signal intensity of the optical signal; and
a controller programmed to control the operation of the probe system by:
(i) positioning the optical probe and the calibration structure proximate one another;
(ii) conveying the optical signal from the optical probe to the calibration structure;
(iii) during the conveying, detecting the signal intensity of the optical signal; and
(iv) during the conveying and also during the detecting, changing the relative orientation between the optical probe and the calibration structure to generate a representation of the signal intensity as a function of the relative orientation between the optical probe and the calibration structure.

* * * * *